United States Patent [19]

Lowrey et al.

[11] Patent Number: 5,021,353

[45] Date of Patent: Jun. 4, 1991

[54] SPLIT-POLYSILICON CMOS PROCESS INCORPORATING SELF-ALIGNED SILICIDATION OF CONDUCTIVE REGIONS

[75] Inventors: Tyler A. Lowrey; Dermot M. Durcan; Trung T. Doan; Gordon A. Haller; Mark E. Tuttle, all of Boise, Id.

[73] Assignee: Micron Technology, Inc., Boise, Id.

[21] Appl. No.: 485,029

[22] Filed: Feb. 26, 1990

[51] Int. Cl.$^5$ .................. H01L 21/265; H01L 21/336
[52] U.S. Cl. .................................. 437/34; 437/44; 437/57; 357/42; 357/44
[58] Field of Search .................. 437/27, 28, 29, 30, 437/34, 56, 57, 200, 192, 40, 41, 44, 233; 357/23.3, 23.4, 40, 41, 42, 44

[56] References Cited

U.S. PATENT DOCUMENTS

| | | | |
|---|---|---|---|
| 4,530,150 | 7/1985 | Shirato | 437/44 |
| 4,577,391 | 3/1986 | Hsia et al. | 437/34 |
| 4,599,789 | 7/1986 | Gasner | 437/34 |
| 4,637,124 | 1/1987 | Okuyama et al. | 437/41 |
| 4,745,086 | 5/1988 | Parrillo | 437/44 |

FOREIGN PATENT DOCUMENTS

| | | | |
|---|---|---|---|
| 0019669 | 2/1981 | Japan | 437/41 |
| 0017164 | 1/1982 | Japan | 437/34 |
| 0055068 | 3/1984 | Japan | 437/41 |
| 0213051 | 10/1985 | Japan | 437/44 |
| 0165355 | 7/1987 | Japan | 437/233 |

Primary Examiner—Olik Chaudhuri
Assistant Examiner—M. Wilczewski

Attorney, Agent, or Firm—Angus C. Fox, III; Stanley N. Protigal; Albert Crowder

[57] ABSTRACT

An improved CMOS fabrication process which uses separate masking steps to pattern N-channel and P-channel transistor gates from a single layer of conductively-doped polycrystalline silicon (poly) and incorporates self-aligned salicidation of conductive regions. The object of the improved process is to reduce the cost and improve the reliability, performance and manufacturability of CMOS devices by a process which features a dramatically reduced number of photomasking steps and which further allows self-aligned salicidation of transistor conductive regions. By processing N-channel and P-channel devices separately, the number of photomasking steps required to fabricate complete CMOS circuitry in a single-polysilicon-layer or single-metal layer process can be reduced from eleven to eight. Starting with a substrate of P-type material, N-channel devices are formed first, with unetched poly left in the future P-channel regions until N-channel processing is complete. The improved CMOS process provides the following advantages over conventional process technology: Use of a masked high-energy punch-through implant for N-channel devices is not required; individual optimization of N-channel and P-channel transistors is made possible; a lightly-doped drain (LDD) design for both N-channel and P-channel transistors is readily implemented; source/drain-to-gate offset may be changed independently for N-channel and P-channel devices; and N-channel and P-channel transistors can be independently controlled and optimized for best LDD performance and reliability.

5 Claims, 13 Drawing Sheets

SPLIT-POLYSILICON CMOS PROCESS INCORPORATING SELF-ALIGNED SILICIDATION OF CONDUCTIVE REGIONS

FIELD OF THE INVENTION

This invention describes a process sequence for the fabrication of Complimentary Metal Oxide Semiconductor (hereinafter "CMOS") integrated circuits. More specifically, it relates to the fabrication of LDD transistors of both channel types, using self-aligned silicidation of gates and source/drain regions to reduce the number of photomasking steps required in a split-polysilicon process.

BACKGROUND OF THE INVENTION

Although CMOS integrated circuit devices are often referred to as "semiconductor" devices, such devices are fabricated from various materials which are either electrically conductive, electrically nonconductive or electrically semiconductive. Silicon, the most commonly used semiconductor material can be made conductive by doping it (introducing an impurity into the silicon crystal structure) with either an element such as boron which has one less valence electron than silicon, or with an element such as phosphorus or arsenic which have one more valence electron than silicon. In the case of boron doping, electron "holes" become the charge carriers and the doped silicon is referred to as positive or P-type silicon. In the case of phosphorus or arsenic doping, the additional electrons become the charge carriers and the doped silicon is referred to as negative or N-type silicon. If dopants of opposite type conductivity are used, counter doping will result, and the conductivity type of the most abundant impurity will prevail. Silicon is used either in single-crystal or polycrystalline form. Polycrystalline silicon is referred to hereinafter as "polysilicon" or simply as "poly". Originally, MOS devices were manufactured from metal (used as the transistor gate), semiconductor material (used as the transistor channel material), and oxide (used as the dielectric between the gate and the substrate. Currently, however, most MOS transistors are fabricated using a conductively-doped polycrystalline silicon layer for the gate material.

CMOS processes begin with a lightly-doped P-type or N-type silicon substrate, or lightly-doped epitaxial silicon on a heavily doped substrate. For the sake of simplicity, the prior art CMOS process will be described using P-type silicon as the starting material. If N-type silicon were used, the process steps would be virtually identical, with the exception that in some cases, dopant types would be reversed. Fabrication of sub-micron CMOS devices having a silicided single poly layer and a single metal layer using prior art technology generally requires at least 11 photoresist masks (or simply "photomasks") to create N-channel and P-channel transistors on a silicon substrate (an additional one or two masks is required if lightly-doped drain design is required for both types of transistors). No attempt is made at siliciding source and drain regions in this process. The function of these 11 masks is described below.

The first photoresist mask is used to define N-wells. This is done by creating a first layer of pad oxide on a lightly-doped P-type substrate, depositing a layer of nitride on top of the pad oxide, masking the nitride layer to expose certain regions which are then implanted with arsenic or phosphorus to create the N-wells. The N-well regions are then oxidized using a first conventional LOCOS (LOCal Oxidation of Silicon) step to create a silicon oxide layer to protect them from an optional boron implant which adjusts the concentration of the P-type substrate for the N-channel devices. During the LOCOS process, the pad oxide serves as a stress relief layer. Alternatively, an oxide deposition or oxide growth step could replace the first LOCOS step, eliminating the need for the first pad oxide layer and the first nitride layer. A subsequent high-temperature drive step is used to achieve the desired N-well junction depth. Following removal of the oxide layer, a second layer of pad oxide is grown over the entire wafer. A second silicon nitride layer is then deposited on top of the pad oxide layer.

The second photomask is used to pattern portions of the second silicon nitride layer which define the future active areas on the wafer.

The third photomask is used to cover the N-well regions in order to effect a selective boron field-isolation implant. Following the stripping of the third photomask, the regions on the wafer that are not protected by the remaining portions of the second silicon nitride layer are oxidized to form field oxide regions using a second conventional LOCOS step. The nitride layer is then stripped, as is the pad oxide layer. A layer of sacrificial oxide is then grown to eliminate the "white ribbon" or Kooi effect in the active areas that follows field oxidation. An unmasked implant may be used as a threshold voltage ($V_T$) adjustment.

The fourth photomask exposes only the channel regions of the N-channel transistors to a high-energy boron punch-through implant. This implant increases both source-to-drain breakdown voltage and the threshold voltage, thus avoiding the short-channel effects which are inherent to nonimplanted, sub-micron N-channel devices. Following the punch-through implant, the fourth photomask is stripped, as is the sacrificial oxide layer. A layer of gate oxide is then grown on all active areas, following which a polysilicon layer is deposited on top of the gate oxide using conventional means (e.g., chemical vapor deposition). The poly layer is then doped with phosphorus, coated with a layer of tungsten silicide by various possible techniques (e.g., chemical vapor deposition, sputtering, or evaporation).

The fifth photomask patterns the silicide-coated polysilicon layer to form the gates of both P-channel and N-channel transistors. Stripping of the fifth photomask is followed by a source/drain oxidation.

The sixth photomask is used to expose only the N-channel source and drain regions to a relatively low-dosage phosphorus implant which creates lightly-doped N- regions. Following the stripping of the sixth mask, a layer of silicon dioxide is deposited on the wafer. An anisotropic etch and a subsequent optional isotropic etch of the silicon dioxide layer leave oxide spacers on the sides of each N-channel and P-channel transistor gate.

The seventh photomask exposes the N-channel source and drain regions to a relatively high-dosage phosphorus or arsenic implant which creates the heavily-doped N+ regions. Following the stripping of the seventh mask, the wafer is optionally subjected to elevated temperature for the purpose of diffusing the N-channel implants.

The eighth photomask is used for the high-dosage implantation of either boron or boron difluoride, which creates heavily doped source and drain regions for the P-channel transistors. Following the stripping of the eighth mask, an elevated-temperature drive step is performed, after which the transistors are fully formed. All structures are then covered by an isolation oxide layer.

The ninth photomask is used to define contact vias which will pass through the isolation oxide layer to the poly structures or active area conductive regions below. A deposition of an aluminum metal layer follows.

The tenth photomask is used to pattern the aluminum layer for circuit interconnects. Using a blanket deposition process, the circuitry is covered with one or more passivation layers.

The eleventh photomask defines bonding pad openings which will expose bonding pad regions on the aluminum layer below. This completes the conventional single-poly, single-metal CMOS process.

The business of producing CMOS semiconductor devices is a very competitive, high-volume business. Process efficiency and manufacturability, as well as product quality, reliability, and performance are the key factors that will determine the economic success or failure of such a venture. Each new generation of CMOS devices is expected to be faster and more compact than the generation it replaces. Four-fold density increases from one generation to the next have become standard. If this increase in density is achieved with no increase in die size, device geometries must be more or less halved. As geometries shrink, each photolithographic step becomes more costly. The increase and cost may be attributed to a number of factors, including:

higher capital costs for precision "state-of-the-art" photolithographic equipment;

lowered yields and decreased reliability due to defect density increases invariably associated with each photomasking step;

an increase in the number of processing steps for each mask level, which slows the fabrication process and requires additional expensive equipment;

the requirement for ultra-clean fabrication facilities which are both expensive to construct and expensive to operate;

greater investment per wafer during fabrication, which increases the cost of scrapping defective devices; and costs associated with the step required subsequent to the masking step, whether it be an implant or an etch.

From the aforementioned discussion, it is evident that the elimination of photomasking steps from a CMOS process will have a direct impact on the cost, reliability, and manufacturability of the product.

A novel process is disclosed in the 1982 Japanese patent issued to Masahide Ogawa (No. 57-17164) for fabricating a CMOS integrated circuit by processing N-channel and P-channel devices separately. As with the conventional CMOS process, a single polysilicon layer is used to form both N-channel and P-channel gates. However, N-channel devices are formed first, with unetched polysilicon left in the future P-channel regions until N-channel processing is complete. The mask used to subsequently pattern the P-channel devices is also used to blanket and protect the already-formed N-channel devices. This process is herein referred to as the split-polysilicon CMOS process. The spilt-polysilicon CMOS process, through largely ignored by semiconductor manufacturers in the U.S. and abroad, holds tremendous potential for reducing photomasking steps in a CMOS process.

A pending U.S. Pat. No. 7/427,639, submitted by Tyler A. Lowrey, Randal W. Chance, and Ward D. Parkinson of Micron Technology, Inc. of Boise, Id. details an improved split-polysilicon CMOS process. The improved CMOS fabrication process is based on the aforementioned split-polysilicon CMOS process developed in Japan by Mashahide Ogawa. The improved process utilizes an unmasked N-channel punch-through implant and unmasked N-channel source/drain implants that are self-aligned to gate electrodes to create high-performance LDD-type N-channel transistors. These high-performance transistors have both punch-through regions and LDD-type source/drain regions. By utilizing the split-polysilicon CMOS process in combination with the unmasked implants, the number of masks required to form both N-channel and P-channel devices can be reduced from eleven (for the standard CMOS process) to eight (for the improved process). P-channel source and drain regions, although of conventional non-LDD design, are offset from the edges of the P-channel gates by undercutting the gates beneath the photoresist during the gate-patterning etch. The gate-patterning photoresist is then used as an offsetting implant mask.

SUMMARY OF THE INVENTION

The object of the present invention is to reduce the cost and improve the reliability, performance and manufacturability of CMOS devices by implementing a variation of the improved split-polysilicon CMOS fabrication process developed by Mssrs. Lowrey, Chance and Parkinson which provides LDd sources and drains for both N-channel and P-channel transistors with no increase in the number of photomasking steps, and incorporates self-aligned silicidation of transistor gates, sources and drains. Like the original Micron-developed improved split-polysilicon CMOS process, the new split-polysilicon silicide process, which is the focus of the present invention, also utilizes eight masks to fabricate both types of transistors. The function of each of the eight required photomasks is described below. For the sake of simplicity, the process will be described using P-type silicon as the starting material. If N-type silicon were used, the process steps would be virtually identical, with the exception that dopant types would be reversed in some cases.

The first photomask is used to form the N-well regions in a conventional manner.

The second photomask is used to conventionally define the active areas by patterning a nitride layer.

The third photomask is used to cover the N-well regions in order to effect the boron field isolation implant, also in accordance with conventional CMOS technology. Following the stripping of the third mask, LOCOS is used to grow the field oxide regions, and an unmasked boron implant is used as a transistor threshold enhancement. The use of a masked punch-through implant at this point is not required. Following the deposition and doping with phosphorus of a polysilicon layer, the process further deviates from convention.

The fourth photomask is used to pattern the gates of the N-channel transistors and to cover the P-channel regions. An anisotropic dry etch is used to form the N-channel transistor gates, following which the fourth mask photoresist is stripped. Following an unmasked self-aligned boron punch-through implant, a source/- drain oxidation is performed. A low-dosage unmasked phosphorus implant then creates the lightly-doped N-regions of the N-channel sources and drains. Spacer oxide deposition is followed by an anisotropic dry etch and an optional isotropic etch (in that order), which leave spacers on both sides of the N-channel gates. Spacer formation is followed by a high-dosage unmasked phosphorus or arsenic implant, which creates the heavily-doped N+ regions of the N-channel sources and drains. Doping of the poly layer in the P-channel regions with the aforementioned N-channel implants will have essentially no effect on P-channel transistor performance, since only the gate is doped, with the future source and drain regions remaining untouched. Since the gate poly is doped n-type anyway, there is no electrical impact on P-channel transistors.

The fifth photomask is used to pattern the gates of the P-channel transistors and to cover the N-channel regions.

An anisotropic etch is used to etch the P-channel transistor gates. A low-dosage boron implant may then be optionally performed in the regions not protected by the fifth photomask, thus creating lightly-doped sources and drains for the P-channel devices. Removal of the fifth photomask is followed by the blanket deposition of a spacer oxide layer, which is anisotropically etched (and optionally subsequently isotropically etched) to create spacers on both sides of the P-channel gates. P-channel spacer formation is followed by a boron or boron-defluoride high-dosage unmasked implant, thus creating heavily-doped sources and drains for the P-channel devices. Since the dosage of the boron-difluoride implant is only approximately one-third to one-seventh the dosage of the arsenic implants used to create the source/drain regions for the N-channel devices, performance of the N-channel devices remains largely unaffected by the partial counter-doping of the N-channel source/drain regions.

A second embodiment of the invention allows P-channel transistor gates to be created by an isotropic dry etch with the fifth photomask in place. The fifth photomask patterns the P-channel transistor gates, and the isotropic dry etch produces gates, the edges of which are purposely undercut (recessed) under the patterning photoresist. After the etch, and with the fifth photomask still in place, a high-dosage boron or boron difluoride implant is used to create P-channel sources and drains. The undercut P-channel gate offsets the high-dosage P-channel source/drain implant such that implant diffusion related to subsequent temperature steps does not result in excessive gate overlap by these implants. Using only a single P-channel source/drain implant eliminates the problem of counter-doping of the N-channel source/drain regions, since all N-channel devices are protected by the fifth photomask. Removal of the fifth photomask is followed by the blanket deposition of a spacer oxide layer, which is anisotropically etched (and optionally subsequently isotropically etched) to create spacers on both sides of the P-channel gates.

A layer of titanium metal is sputter deposited (sputter deposition is only one of several useable techniques) on top of all the circuitry. A sintering step causes the titanium to react with all unoxidized silicon (i.e., all gates and source/drain regions for both N-channel and P-channel transistors) to form titanium silicide. A sulfuric acid and hydrogen peroxide bath and a subsequent ammonium hydroxide and hydrogen peroxide bath remove all unreacted titanium as well as titanium nitride. This self-aligned siliciding step greating improves the speed of both N-channel and P-channel devices.

At this point, transistor formation using the improved CMOS process is complete.

The sixth, seventh, and eighth photomasks are used to complete the circuitry in a conventional manner, and correspond respectively to the ninth, tenth, and eleventh photomasks utilized for the previously-described conventional process.

The improved CMOS process provides the following advantages over conventional process technology:

It permits a dramatic reduction in the number of photomasking steps required in a modern high density CMOS process;

It is applicable to both low and high density (submicron) integration levels;

Use of a masked high-energy boron punchthrough implant for N-channel transistors is not required (a unmasked self-aligned implant after polysilicon deposition is used instead);

Individual optimization of N-channel and P-channel transistors is made possible;

It allows lightly-doped drain (LDD) design for both N-channel and P-channel transistors (the LDD design makes possible a significant reduction in device length without incurring the detrimental "short channel" effects seen with conventional transistor design, in addition to greatly reducing high electric field hot-electron effects);

Offset distance of source/drain implants are easily changed independently for N-channel and P-channel devices, allowing greater flexibility for device optimization;

The N-channel and P-channel transistors can be independently controlled and optimized for best LDD performance and reliability (this fact allows maximum shrinkablity for subsequent generation products and reduces retooling for changes in N-channel or P-channel transistors);

It is compatible with contemporary IC fabrication equipment, and requires no exotic new equipment;

Self-aligned siliciding of all transistor gates, sources and drains is accomplished without adding any masking steps; and The reduced number of process steps and reduced mask count improves electrical sort yields, reduces manufacturing costs, increases productivity, reduces cycle times through fabrication, reduces total process inventory needed for a given run rate, allows more rapid response to process changes in volume quantities, and provides more products having less variation.

BRIEF DESCRIPTION OF THE DRAWINGS

The drawing Figures each show cross-sections of a portion of a semiconductor circuit device which utilizes the present invention.

DETAILED DESCRIPTION OF THE PREFERRED EMBODIMENT

Figure 1:
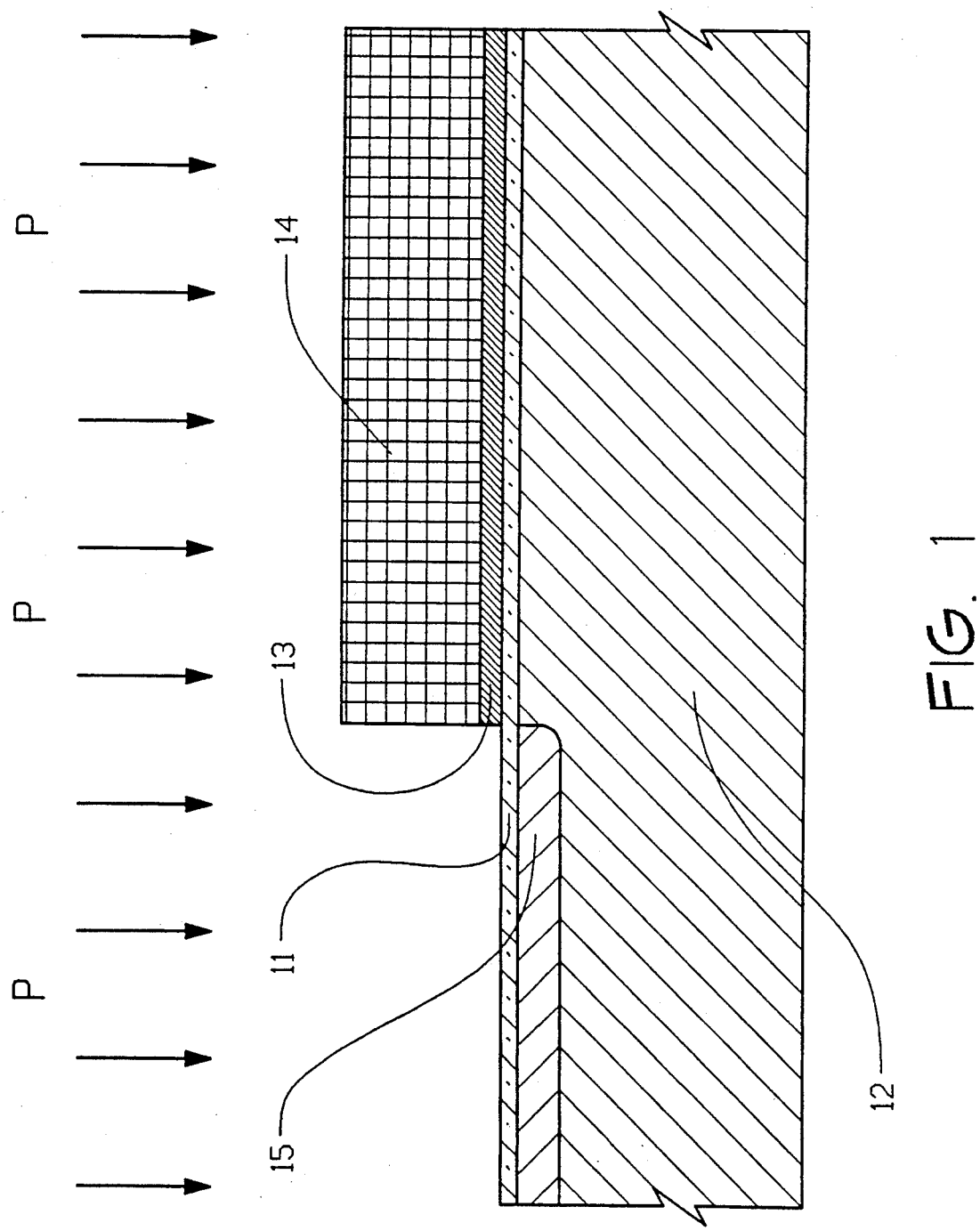
FIG. 1 shows a lightly-doped P-type silicon substrate being implanted with phosphorus to create a well of N-type silicon following the growth of a first layer of pad oxide, deposition of a first silicon nitride layer, masking of the first silicon nitride layer with a first photoresist mask and etching of the silicon nitride layer.

Referring now to FIG. 1, a first pad oxide layer 11 is grown on lightly-doped P-type silicon substrate 12. A first silicon nitride layer 13 is then deposited on top of first pad oxide layer 11, following which a first photomask 14 is used to expose only those regions on substrate 12 that are to receive a first phosphorus implant. The phosphorus implant creates N-well regions 15. (Only a single such region is shown in this figure.)

Figure 2:
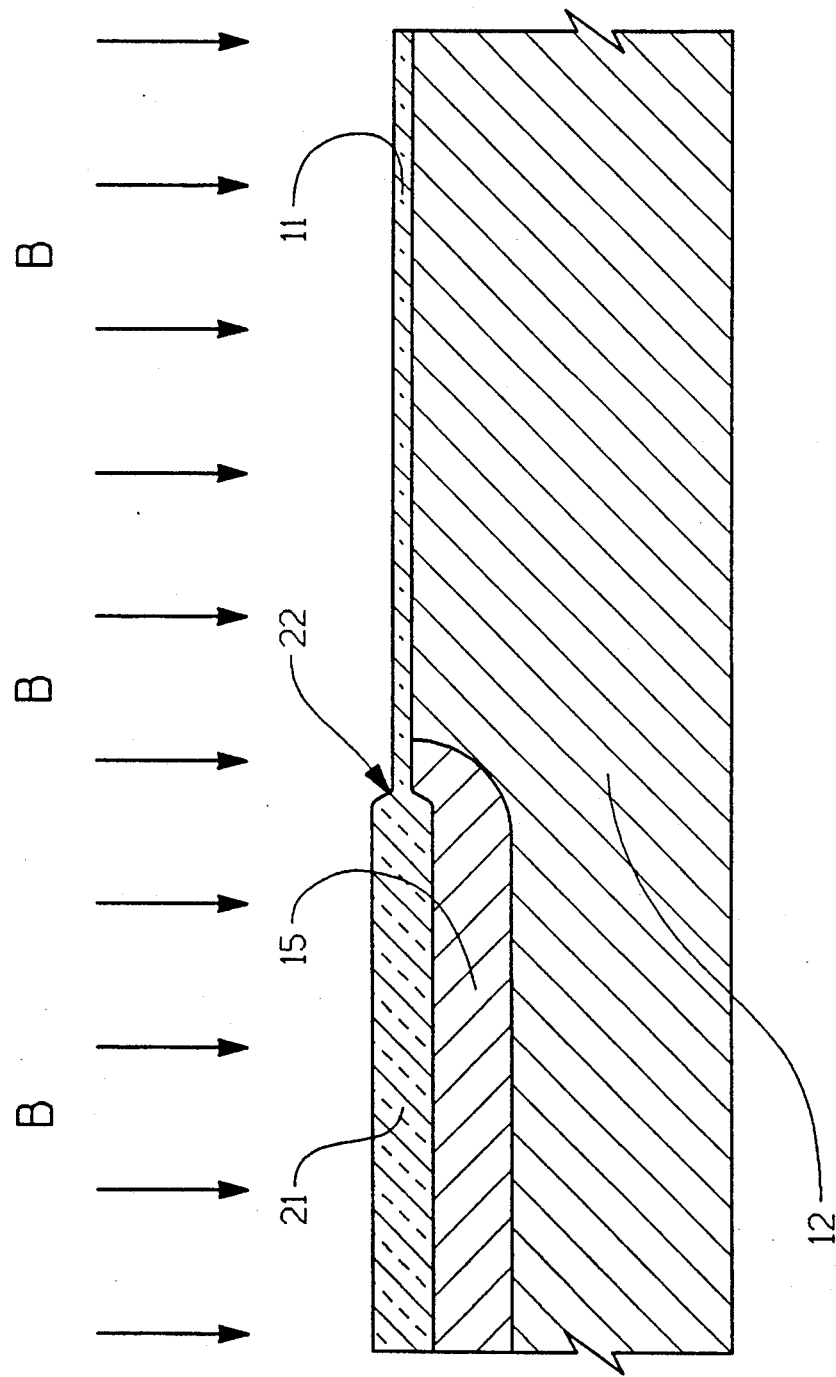
FIG. 2 shows the semiconductor device of FIG. 1 being subjected to an optional P-type substrate boron adjustment implant following a high temperature step which has caused the N-well phosphorus implant to diffuse into the substrate, oxidation of silicon in the N-well region where it was unprotected by the first nitride layer to create an oxide mask, and stripping of the first nitride layer.

Referring now to FIG. 2, following the stripping of the first photomask, a silicon dioxide masking layer 21 is grown in an oxidizing environment. The first pad oxide layer 11 acts to relieve stresses in the bird's beak region 22 at the edge of masking layer 21 during the oxide growth step. Following the stripping of first silicon nitride layer 13, the wafer is exposed to an optional boron adjustment implant which optimizes the concentration of P-type charge carriers in the substrate regions outside the N-well where N-channel devices will be created. Silicon dioxide masking layer 21 protects the N-well region from this boron adjustment implant. Next, the phosphorus atoms implanted in the N-well regions 15 and the boron atoms outside the N-well from the optional adjustment implant are driven into the substrate during a high-temperature step.

Figure 3:
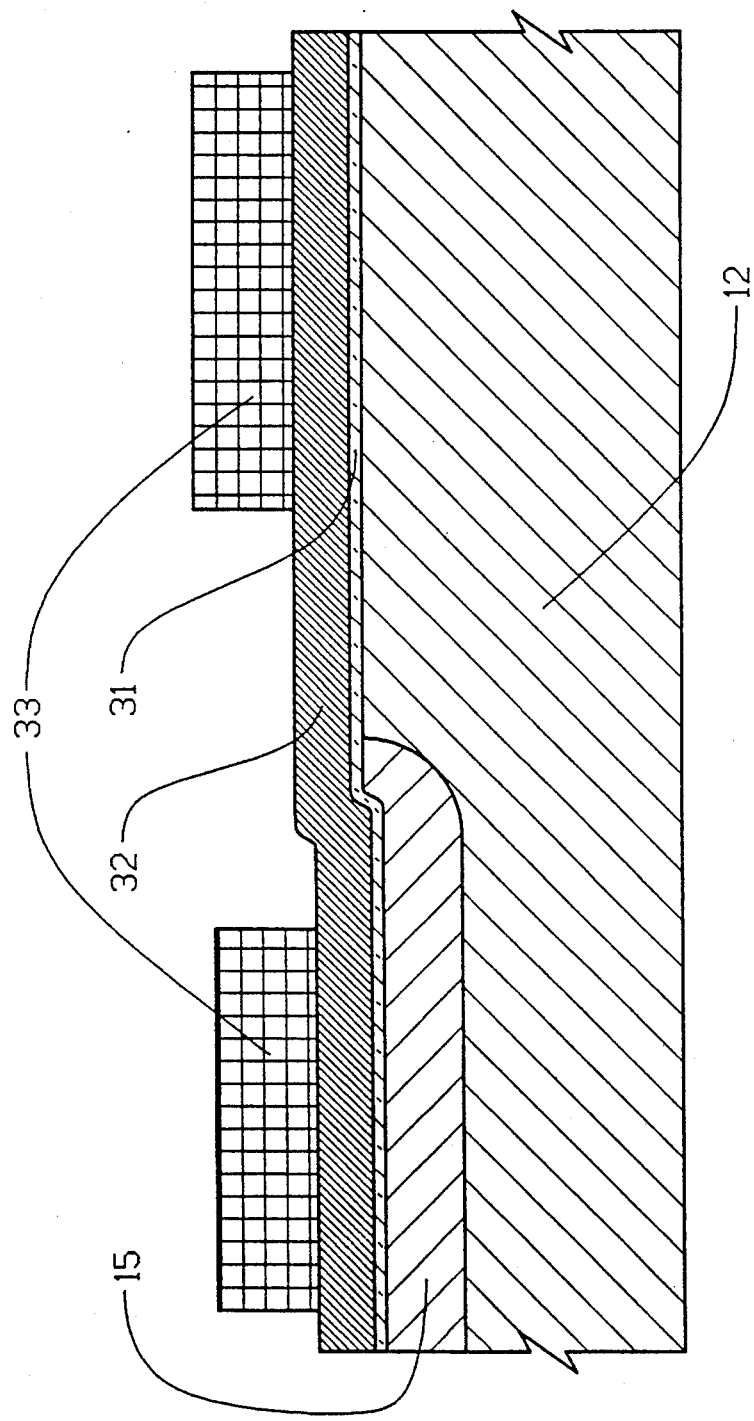
FIG. 3 shows the semiconductor device of FIG. 2 following the stripping of the oxide mask and first layer of pad oxide, growth of a second layer of pad oxide, deposition of a second layer of silicon nitride and masking of the second silicon nitride layer with a second photomask to define active areas.

Referring now to FIG. 3, following the stripping of silicon dioxide masking layer 21 and first pad oxide layer 11, a second pad oxide layer 31 is grown on the surface of the entire wafer. This is followed by the deposition of a second silicon nitride layer 32. A second photomask 33 defines active areas for both P-channel devices (those that will be constructed in the N-well) and N-channel devices.

Figure 4:
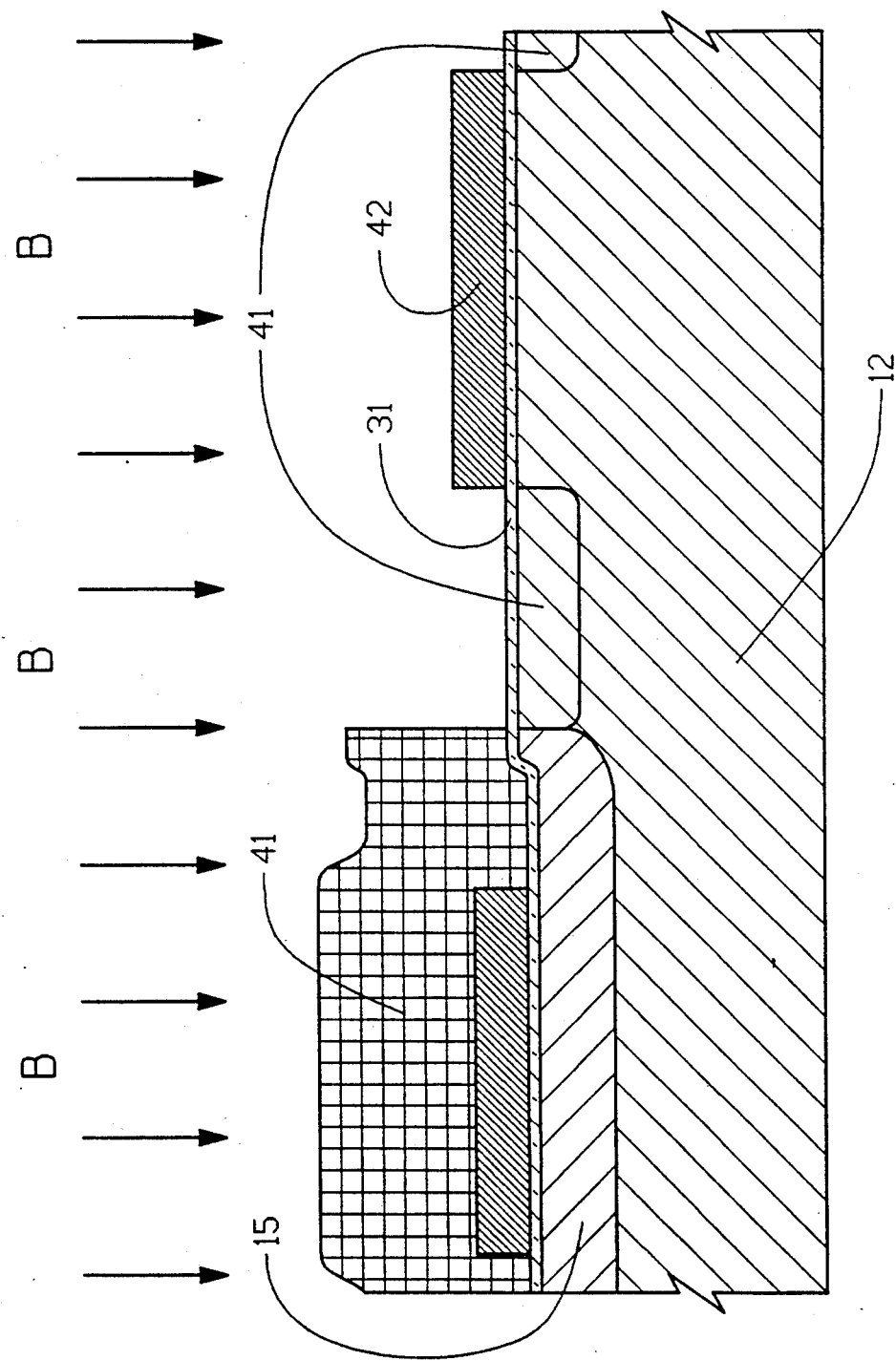
FIG. 4 shows the semiconductor device of FIG. 3 undergoing a field isolation boron implant with the N-well region masked with a third photomask following an etch of the second nitride layer.

Referring now to FIG. 4, following the etching of second nitride layer 32, the N-well regions are covered with a third photomask 41. The water is then subjected to a field isolation boron implant. During this step, boron atoms are implanted only in the N-channel field regions. Third photomask prevents the implantation of boron in the N-well field regions and the N-channel active area nitride mask 42 (a remnant of nitride layer 32) prevents the implantation of born into the future N-channel active areas.

Figure 5:
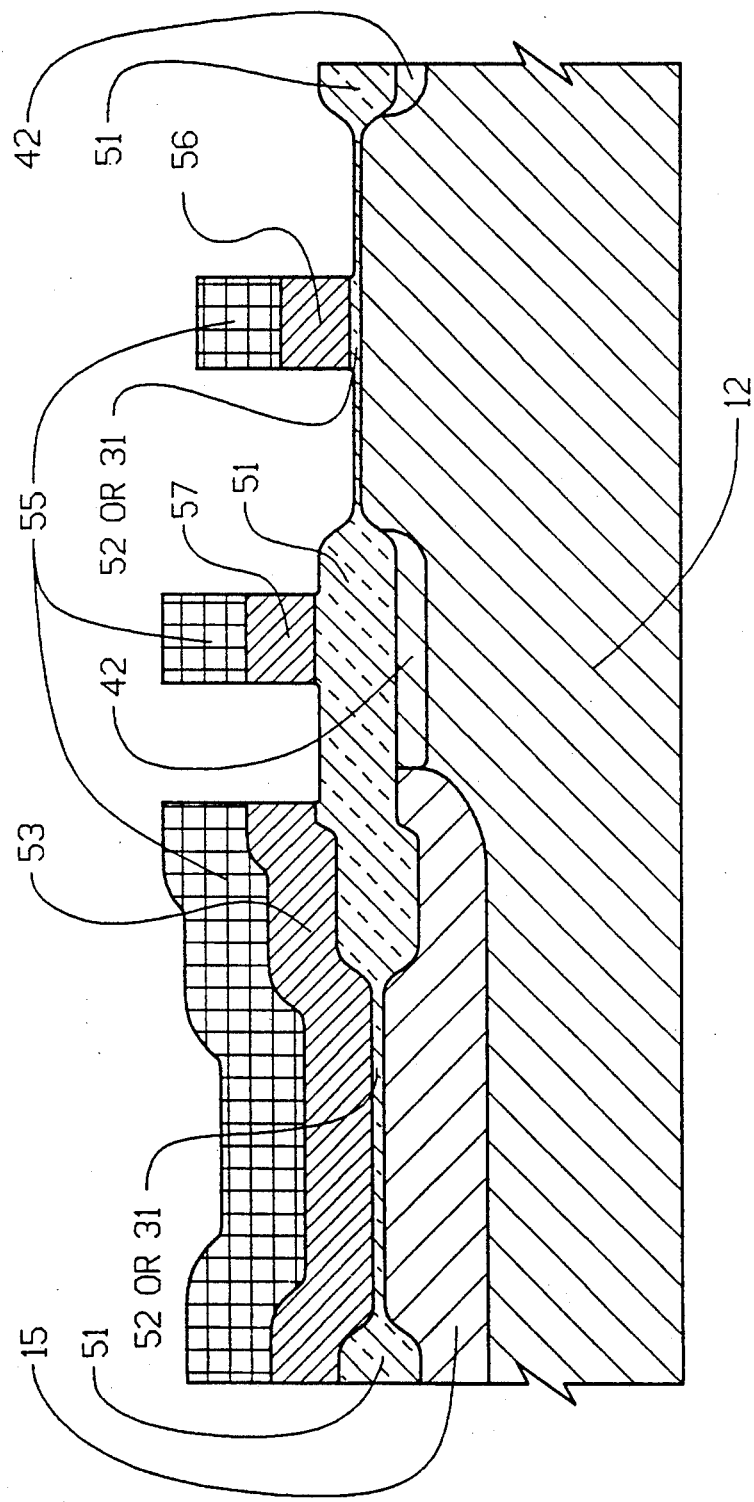
FIG. 5 shows the semiconductor device of FIG. 4 following the growth of field oxide using the LOCOS process, stripping of the second nitride layer, deposition of a polysilicon layer, masking of the poly layer with a fourth photomask, and a first etch of the poly layer to create gates and interconnects for N-channel devices and an unbroken layer of poly in the N-well regions.

Referring now to FIG. 5, following the stripping of third photomask 41 and growth of field oxide regions 51 using the conventional LOCOS oxidation process, second nitride layer 32 is stripped, as is second pad oxide layer 31. A layer of sacrificial oxide is then grown to eliminate the "white ribbon" effect in active areas that resulted from field oxidation. Following an unmasked $V_T$ implant which adjusts transistor threshold voltage, the sacrificial oxide layer is stripped and a gate oxide layer 52 is grown. Alternatively, second pad oxide layer 31 may be left intact in order to serve as transistor gate oxide in both N-channel and P-channel regions. A polysilicon layer 53 is blanket deposited and then doped with phosphorus to render it conductive. A fourth photomask 55 is used to cover or blanket polysilicon layer 53 in the P-channel regions and to define N-channel transistor gates 56 and N-channel interconnects 57. The etch of polysilicon layer 53, which follows the fourth photomasking step, also removes a small amount of the exposed portions of field oxide regions 51 and gate oxide layer 52 (or second pad oxide layer 31 if it is used as gate oxide).

Figure 6:
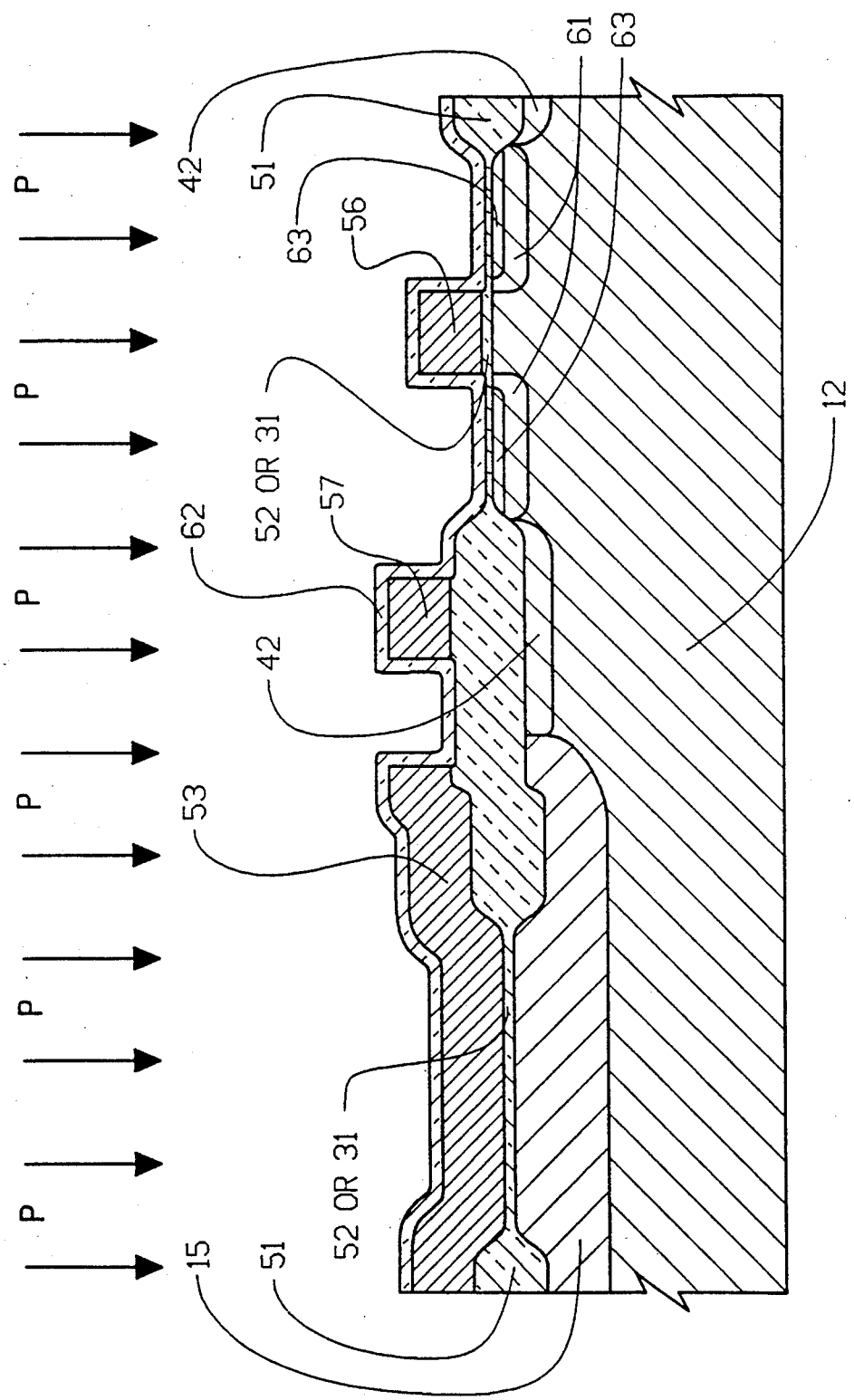
FIG. 6 shows the semiconductor device of FIG. 5 following the stripping of the fourth photomask, a self-aligned boron punch-through implant, thermal growth of a mini-spacer oxide layer, and a self-aligned low-dosage phosphorus N-source/drain implant.

Referring now to FIG. 6, following the stripping of fourth photomask 54, the wafer is subjected to an unmasked low-dosage boron implant, which serves as a N-channel punch-through voltage enhancement, creating punch-through implant regions 61 that extend to the edges of transistor gates 56. This is followed by a thermal oxidation or chemical vapor deposition (CVD) to create a mini-spacer oxide layer 62 having a thickness in the range of 300 to 1500 angstroms. The purpose of mini-spacer oxide layer 62 is to coat the sides of transistor gates 56, so that when the wafer is subjected to a low-dosage phosphorus implant, lightly-doped n-type source/drain regions 63 are created for N-channel devices, said lightly-doped n-type source/drain regions 63 being offset from the vertical boundaries of punch-through implant regions 61 by the vertical segments of mini-spacer oxide layer 62 on the edges of the N-channel transistor gates 56.

Figure 7:
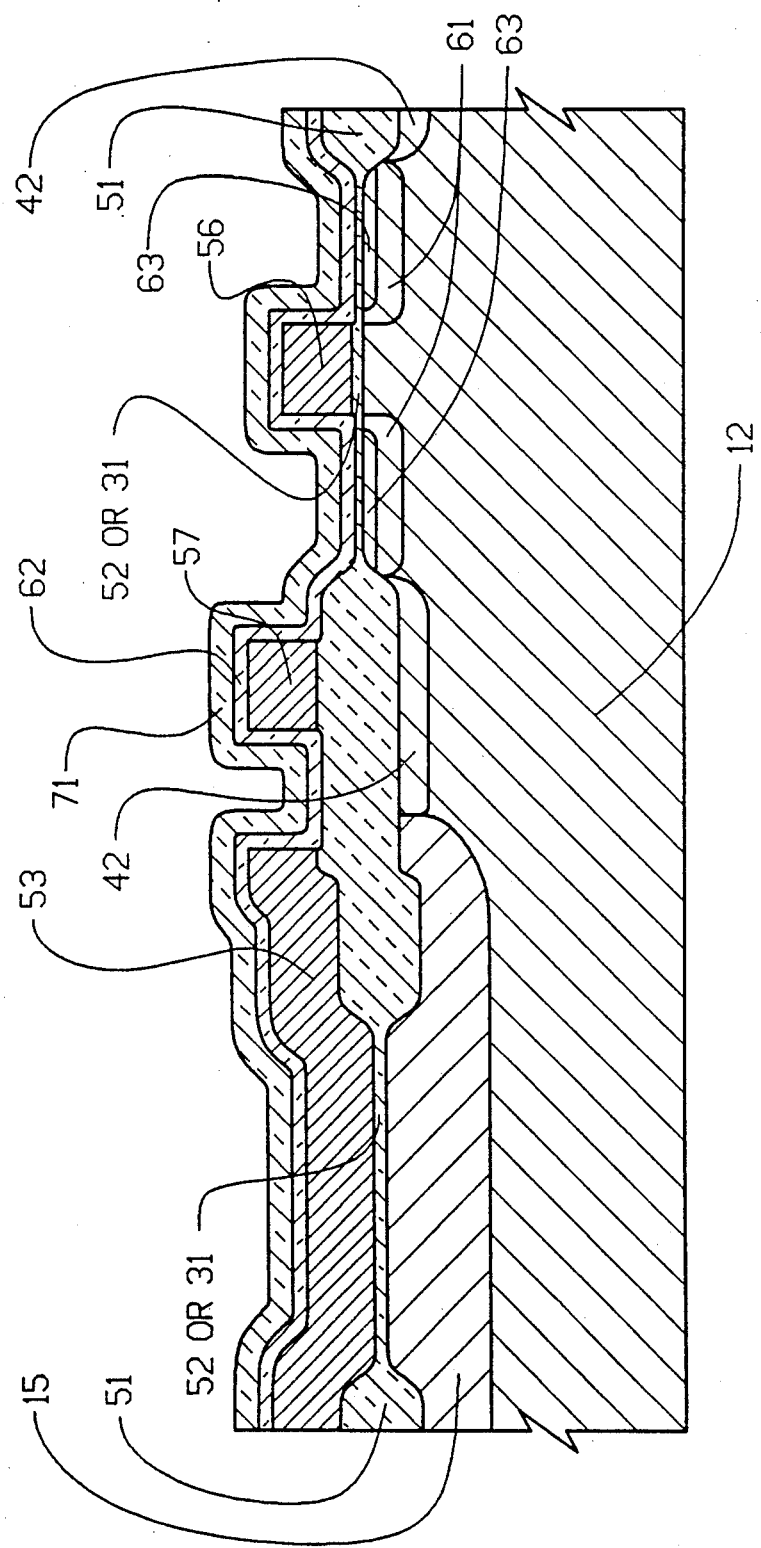
FIG. 7 shows the semiconductor device of FIG. 6 following the CVD deposition of a first spacer oxide layer.

Referring now to FIG. 7, all circuitry is blanketed with a first spacer oxide layer 71 by one of various techniques (e.g., chemical vapor deposition).

Figure 8:
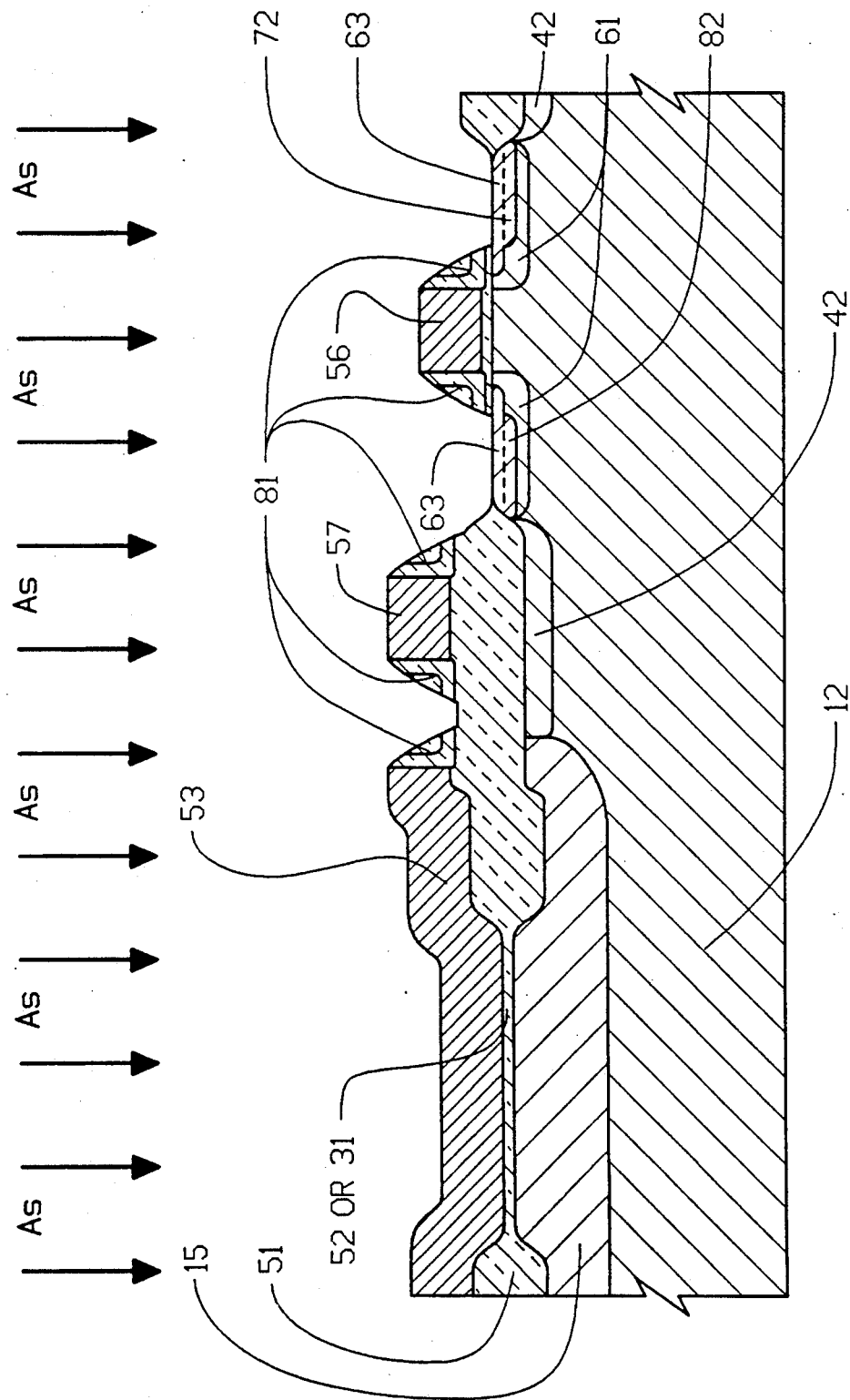
FIG. 8 shows the semiconductor device of FIG. 7 following an anisotropic etch and optional isotropic etch of the first spacer oxide layer, and a self-aligned arsenic N+source/drain implant.

Referring now to FIG. 8, first spacer oxide layer 71 and mini-spacer oxide layer 62 are etched with a first anisotropic etch, then optionally etched once again with a first isotropic etch to form a first set of sidewall spacers 81 for N-channel transistor gates 56, N-channel interconnects 57 and the portion of polysilicon layer 53 which blankets the P-channel regions. The anisotropic etch is used to remove most of the spacer oxide layers, but not to the point where the substrate is cleared. The task of clearing the substrate is left to the wet etch, which can be made far more selective to silicon dioxide than to the substrate, thus minimizing silicon crystal damage on the substrate surface. A high-dosage arsenic or phosphorus implant then creates self-aligned heavily doped n-type source/drain regions 82 for N-channel devices. The high-dosage implant is self-aligned to the edges of the N-channel transistor gates 56.

Figure 9:
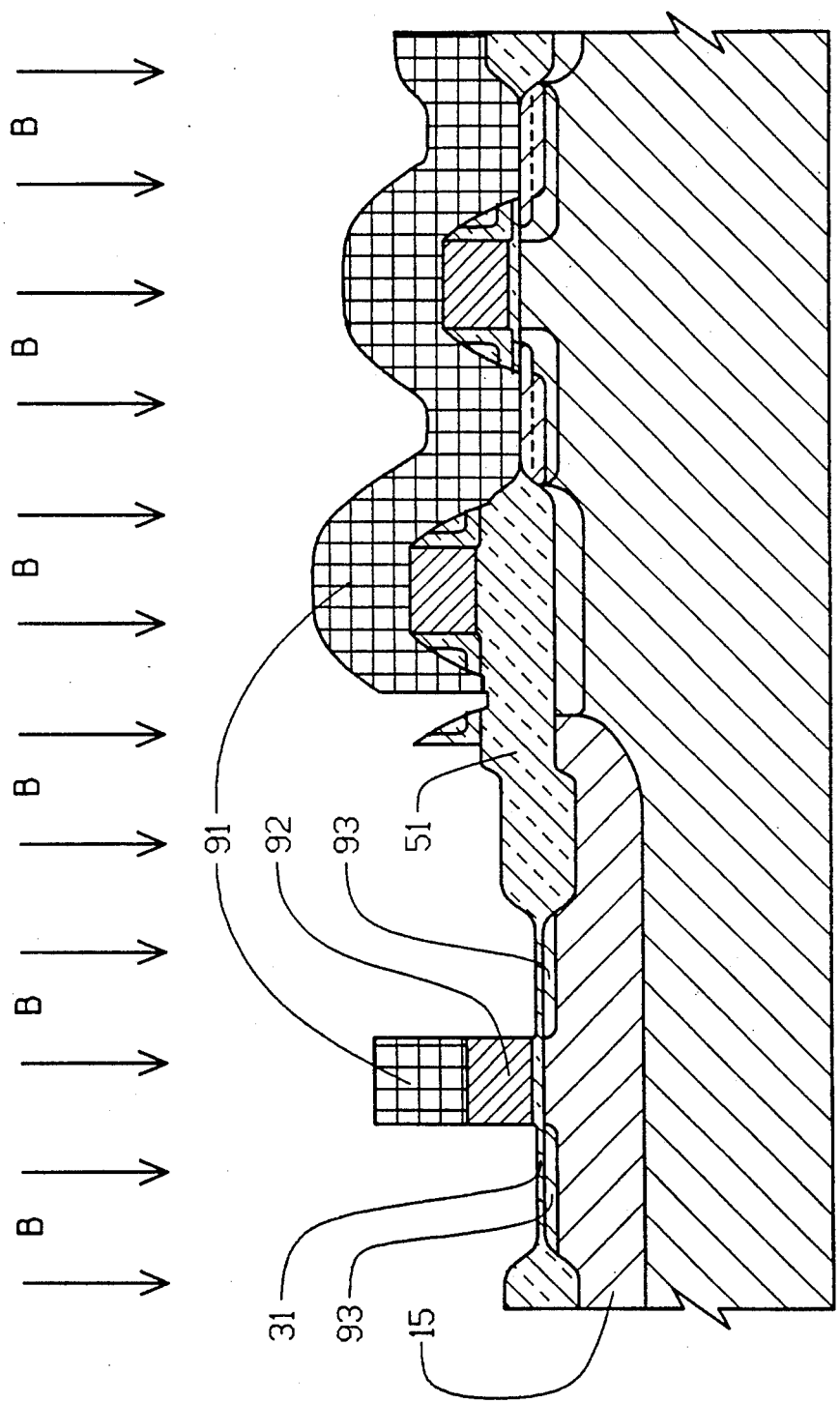
FIG. 9 shows the semiconductor device of FIG. 8 following a second etch of the poly layer using a fifth photomask which protects the already-formed N-channel devices and patterns the gates of P-channel devices and a low-dosage boron implant which creates lightly-doped source and drain regions for the P-channel devices.

Referring now to FIG. 9, the next step in the improved CMOS process is the masking of the wafer with a fifth photomask 91 which covers or blankets the already-formed N-channel devices and defines P-channel transistor gates 92 and interconnects (not shown in this Figure). A subsequent etch of polysilicon layer 53 creates those P-channel gates and interconnects. Following the creation of P-channel transistor gates 92 and interconnects, a low-dosage boron implant creates lightly-doped p-type source/drain regions 93 for P-channel devices. These lightly-doped P-type source/drain regions are aligned to the edges of the P-channel transistor gates 92.

Figure 10:
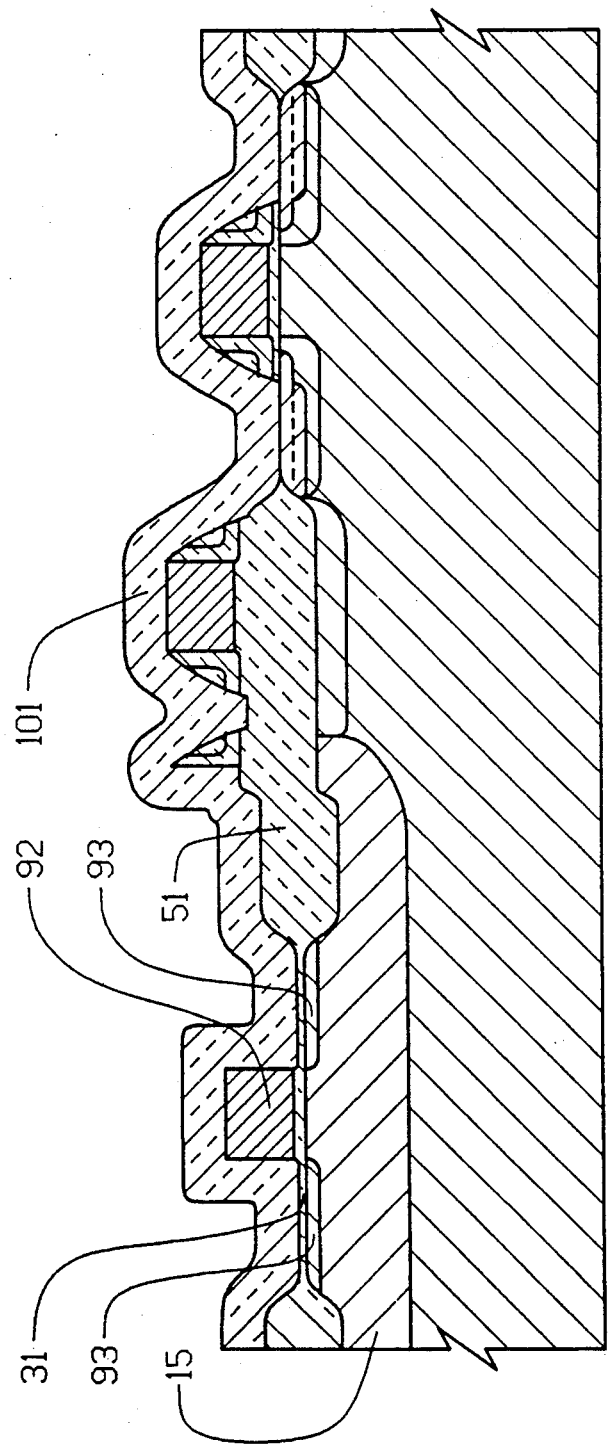
FIG. 10 shows the semiconductor device of FIG. 9 following the deposition of a second spacer oxide layer.

Referring now to FIG. 10, the circuitry is then blanketed with a second spacer oxide layer 101 using one of several techniques (e.g., chemical vapor deposition).

Figure 11:
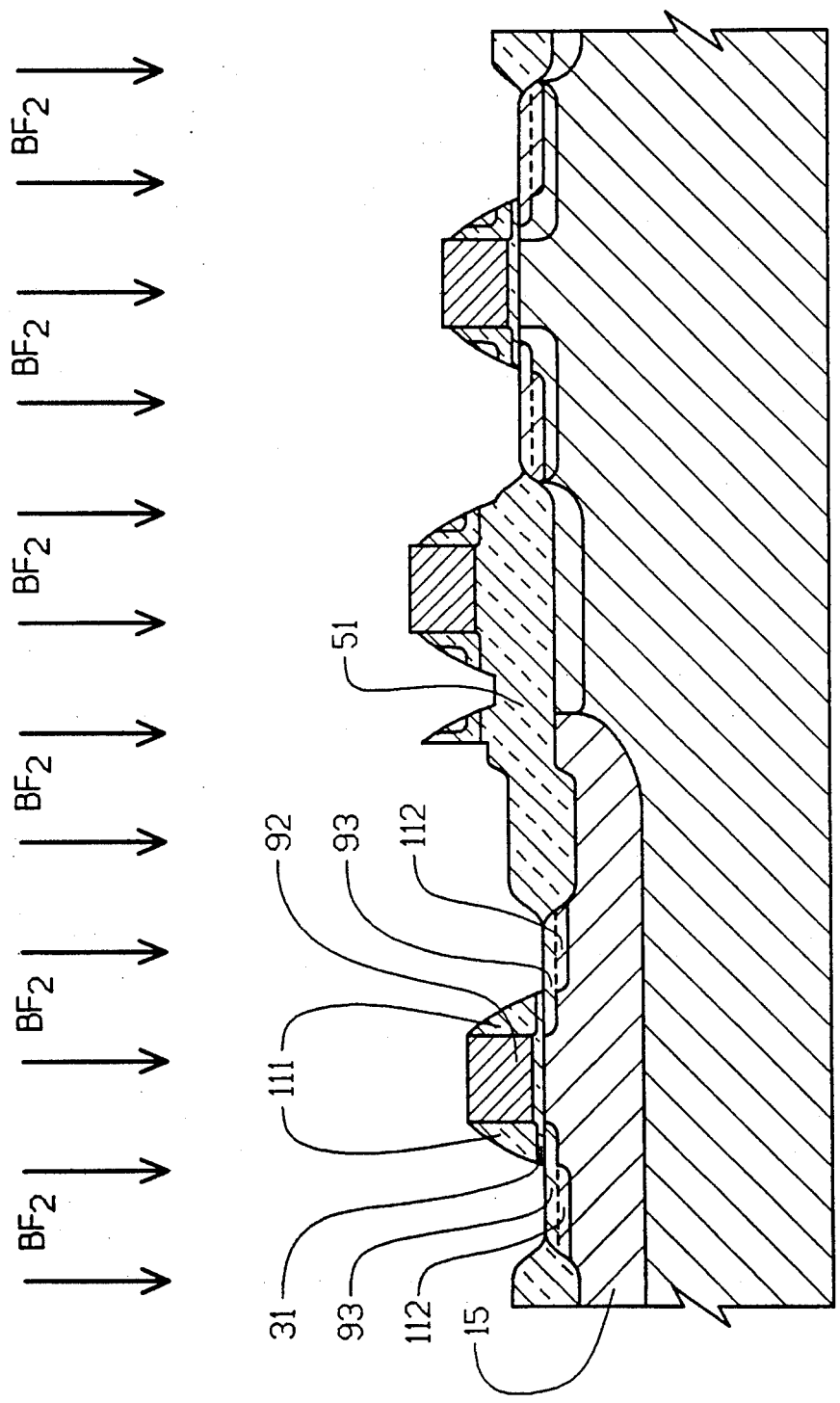
FIG. 11 shows the semiconductor device of FIG. 10 following an anisotropic etch and optional isotropic etch of the second spacer oxide layer, and a high-dosage boron difluoride implant that creates heavily-doped source and drain regions for the P-channel devices.

Referring now to FIG. 11, second spacer oxide layer 101 is etched with a second anisotropic etch, then optionally etched again with a second isotropic etch to create a second set of sidewall spacers 111 for the P-channel transistor gates 92 and P-channel interconnects (not shown). An unmasked high-dosage boron or boron difluoride implant is then used to create self-aligned, heavily-doped p-type source/drain regions 112 for P-channel devices. In order to prevent a deleterious degree of counter-doping within the N-channel source/drain regions, the boron difluoride implant is maintained at a level that will result in a molecular concentration of dopant in the P-channel regions that is only one-third to one-seventh that of the arsenic implant in the N-channel regions.

In spite of the fact that the concentration of the unmasked boron-difluoride implant is maintained at a relatively low level, some counterdoping of the N-channel source/drain regions is inevitable, resulting in an increase in the sheet resistance of the N-channel source/drain regions, which measurably decreases the speed of the N-channel devices. In addition, the relatively low boron-difluoride implant concentration results in P-channel source/drain regions of relatively high resistance and, therefore, P-channel devices that are slow in relation to the already degraded N-channel devices. In order to create, with this reduced-mask CMOS process, circuitry with optimum speed characteristics, it is essential to reduce the sheet resistance of both N-channel and P-channel source/drain regions. This is accomplished by subjecting the circuitry to self-aligned silicidation (also referred to as salicidation).

Figure 12:
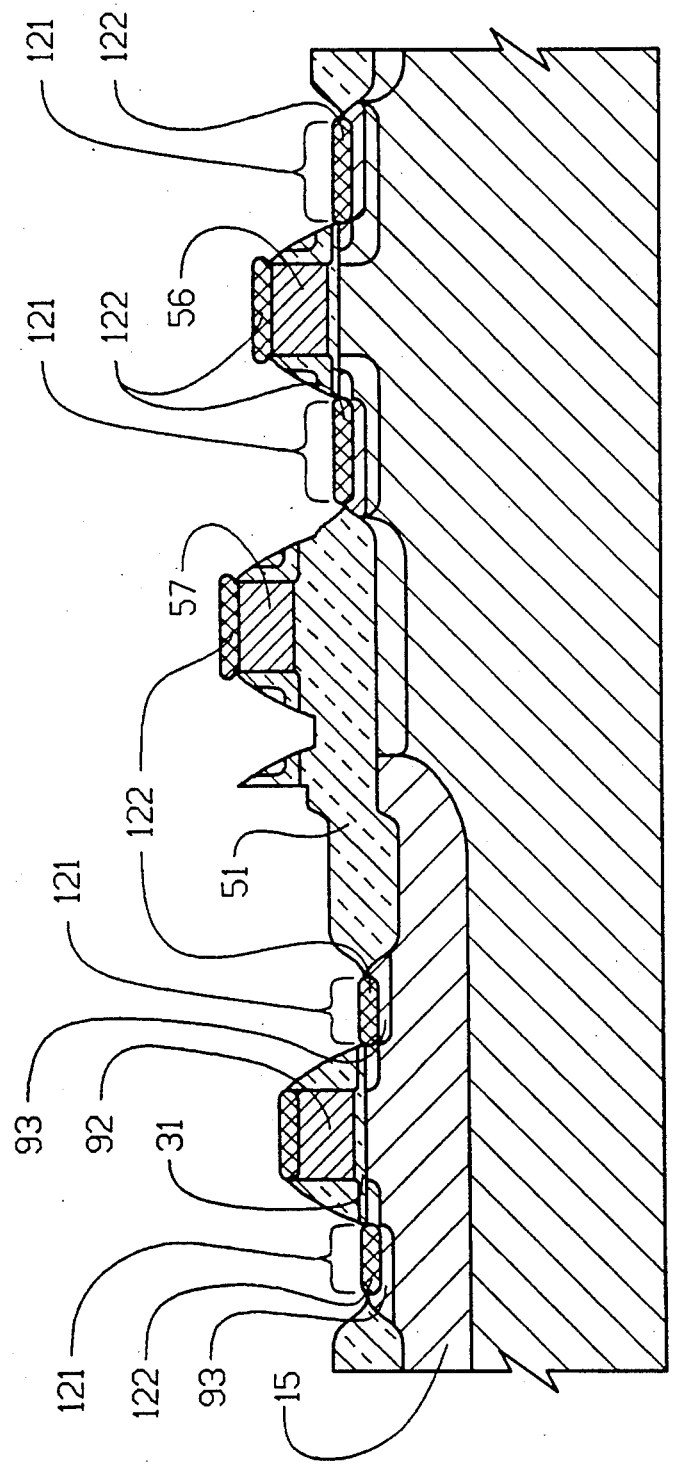
FIG. 12 shows the semiconductor device of FIG. 11 following the deposition, sintering and double-bath etch of a titanium layer in order to create self-aligned titanium silicide regions on all exposed conductive regions.

Referring now to FIG. 12, all exposed conductive regions (i.e., N-channel transistor gates 56, P-channel transistor gates 92, N-channel interconnects 57, P-channel interconnects, as well as active areas 121 for both N and P-channel devices) have been silicided with titanium in a conventional self-aligned process which begins with the sputter deposition of a titanium layer, sintering of the titanium layer in a nitrogen ambient, and etching of the titanium layer with a sulfuric acid and hydrogen peroxide bath and a subsequent ammonium hydroxide and hydrogen peroxide bath which removes titanium nitride, but not the titanium silicide 122 that has been formed. Silicidation of transistor gates, sources and drains with other refractory metals such as cobalt, tungsten, and platinum may be substituted for silicidation with titanium using processes similar to the one described above. However, the use of titanium is preferred because of its relatively low cost, relatively high conductivity and relative ease of use.

Figure 13:
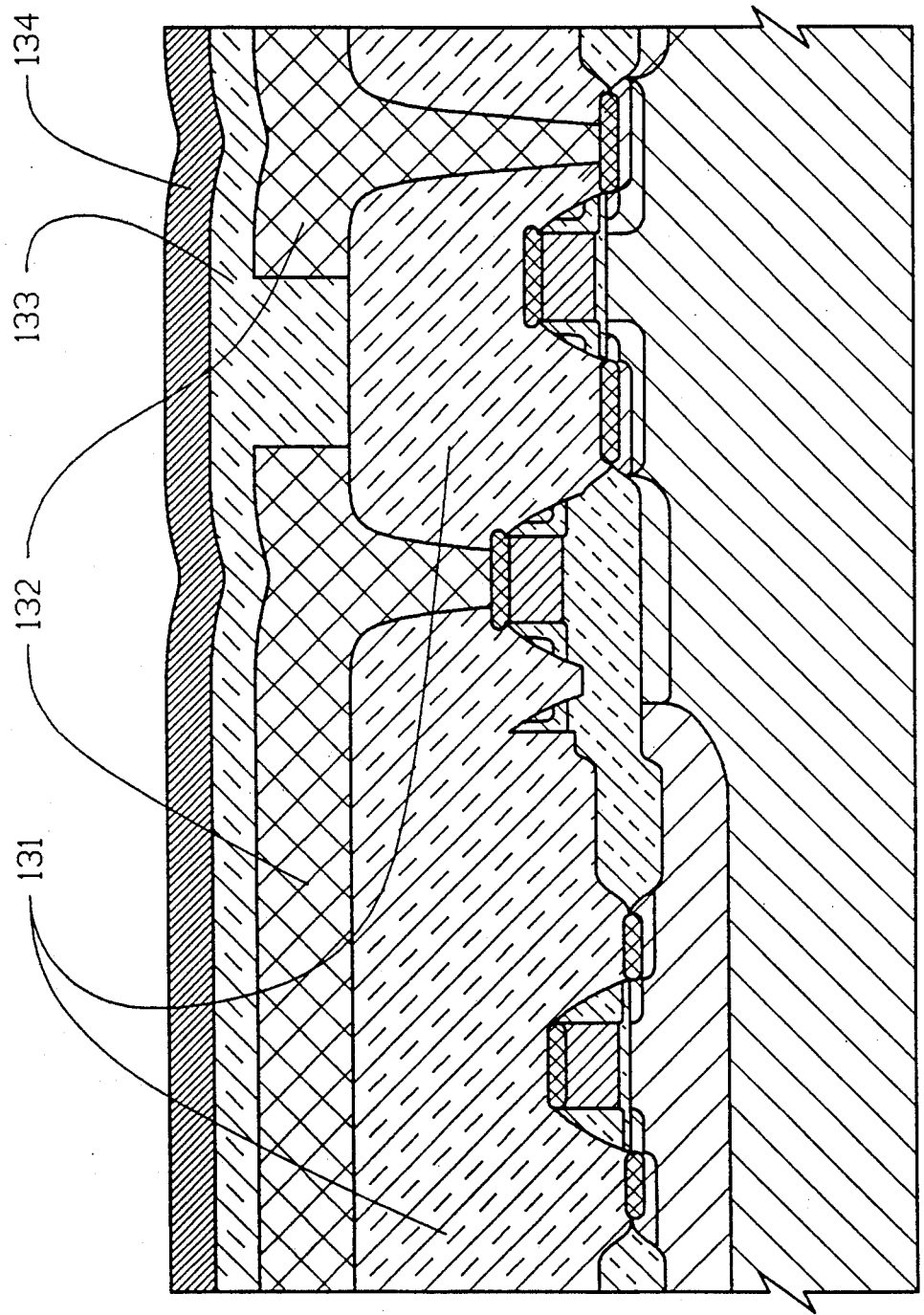
FIG. 13 shows the semiconductor device of FIG. 12 completed using conventional processing technology.

Referring now to FIG. 13, conventional processing technology is used to complete the circuitry. All structures have been covered by an oxide isolation layer 131, which may be doped with phosphorus, boron or both. A sixth photomask (not shown) has been used to define contact vias through oxide isolation layer 131 through which connection to the poly structures or active area conductive regions below can be made. As an aluminum metal layer 132 is deposited, the aluminum metal layer forms on the sidewalls and bottom of each via, making contact with poly structures or active area conductive regions below. Aluminum metal layer 132 is masked with a seventh photomask (not shown), which is used to create circuit interconnects. Deposition of an oxide passivation layer 133 is followed by the deposition of a nitride passivation layer 134. After an eighth photomask is used to define bonding pad openings in the passivation layers which expose bonding pad regions on aluminum layer 132 below, the polysilicon CMOS process incorporating self-aligned silicidation of conductive regions is complete.

The entire salicide split-polysilicon CMO process has been described heretobefore with reference to eight photomasks that are required for completion of the circuitry, beginning with an unprocessed silicon wafer. However, the novel portion of the process covered by the claims, which follow, employs only the fourth and fifth photomasks. Therefore, in the interest of simplicity, the photomask referred to in this disclosure as the fourth photomask will be referred to in the claims as the first photomask. Likewise, the photomask referred to in the specification as the fifth photomask will be referred in the claims as the second photomask.

Although only several embodiments of the improved process have been described herein, it will be apparent to one skilled in the art that changes and modifications may be made thereto without departing from the spirit and the scope of the invention as claimed. For example, the same process flow could be used to create P-channel and N-channel devices on a lightly-doped N-type substrate (arsenic or phosphorus-doped silicon having a conductivity opposite to that of the lightly-doped P-type substrate used to begin the process described in detail heretofore). In such a case, a P-well, rather than an N-well would be created in the substrate, and so fourth. Moreover, the process approach explained herein in the context of a single conductive gate layer application could also be applied to more complex CMOS process such as multi-level polysilicon and/or multi-level metal applications.

We claim:

1. An improved process for the fabrication of CMOS integrated circuits on semiconductor material having both N-type material regions and P-type material regions, each of which is covered by a gate dielectric layer, said process comprising the following sequence of steps:

a) a blanket deposition of conductive layer on top of the gate dielectric layer;

b) masking of said conductive layer with a first photomask which, in P-type material regions, defines N-channel gates and interconnects, and in N-type material regions, blankets said conductive layer;

c) etching away unmasked portions of said conductive layer and underlying portions of the gate dielectric layer to form N-channel gates and interconnects;

d) stripping said first photomask;

e) implantation of a P-type conductivity-creating impurity self-aligned to said N-channel gates which functions as a punchthrough implant, the conductive layer masking the N-type regions from the implanted P-type impurity;

f) creation of a mini-spacer oxide layer on at least N-channel transistor gate sidewalls;

g) low-dosage implantation of an N-type conductivity-creating impurity to create lightly-doped drain and source regions self-aligned to said mini-spacer oxide layer, the conductive layer masking the N-type material regions from this low-dosage implantation of an N-type impurity;

h) blanket deposition of a first silicon dioxide layer;

i) anisotropic etching of said first silicon dioxide layer to create N-channel transistor gate sidewall spacers;

j) high-dosage implantation of an N-type conductivity-creating impurity to create heavily-doped drain and source regions self-aligned to said N-channel transistor gate sidewall spacers, the conductive layer masking the N-type material regions from this high-dosage implantation of an N-type impurity;

k) using a second photomask to blanket the P-type material regions and to define P-channel gates and interconnects in the N-type material regions;

l) etching away unmasked portions of said conductive layer and underlying portions of the gate dielectric layer to form P-channel gates and interconnects;

m) low-dosage implantation of a P-type conductivity-creating impurity to create lightly-doped drain and source regions self-aligned to said P-channel gates, said second photomask blocking this low-dosage implantation of a P-type impurity in the P-type material regions;

n) blanket deposition of a second silicon dioxide layer;

o) anisotropic etching of said second silicon oxide layer to create P-channel transistor gate sidewall spacers;

p) unmasked high-dosage implantation of a P-type conductivity-creating impurity to create heavily-doped drain and source regions self-aligned to said P-channel transistor gate sidewall spacers, said unmasked high dosage implantation being effected at a level that is substantially less than that employed for said high-dosage implantation of an N-type conductivity-creating impurity which created the heavily-doped drain and source regions; and q) silicidation of all exposed silicon regions.

2. The process of claim 1 wherein silicidation of all exposed silicon regions comprises the following sequence of steps:

a) deposition of a titanium metal layer;

b) sintering of said titanium metal layer in a nitrogen ambient to create titanium silicide on all exposed silicon regions and titanium nitride elsewhere; and c) etching away all titanium nitride.

3. The process of claim 1, wherein said mini-spacer oxide layer is created through chemical vapor deposition.

4. The process of claim 1, wherein said mini-spacer oxide layer is thermally grown.

5. The process of claim 1, wherein said unmasked high dosage implantation is effected at a level that is substantially within the range of one-third to one-seventh of that employed for said high-dosage implantation of an N-type conductivity-creating impurity.

* * * * *